United States Patent [19]

Gilbreath et al.

[11] Patent Number: 4,953,951
[45] Date of Patent: Sep. 4, 1990

[54] METHOD FOR MAKING HOLOGRAMS WITH COHERENT RADIATION FROM A STABILIZED LASER DIODE THAT HAS BEEN ACTIVELY COOLED

[75] Inventors: Gail C. Gilbreath, Accokeek, Md.; Anne E. Clement, Birmingham, Mich.

[73] Assignee: The United States of America as represented by the Secretary of the Navy, Washington, D.C.

[21] Appl. No.: 143,492

[22] Filed: Jan. 13, 1988

[51] Int. Cl.$^5$ .............................................. G03H 1/00
[52] U.S. Cl. .................................... 350/320; 350/3.6; 356/347
[58] Field of Search .................. 350/3.64, 3.69, 3.6, 350/3.7, 320; 356/347; 372/34, 35, 36

[56] References Cited

U.S. PATENT DOCUMENTS

| | | | |
|---|---|---|---|
| 3,749,470 | 7/1973 | Brown et al. | 356/347 |
| 4,542,989 | 9/1985 | Remijan | 356/373 |
| 4,594,003 | 6/1986 | Sommargrein | 356/359 |
| 4,631,728 | 12/1986 | Simons | 372/34 |
| 4,699,446 | 10/1987 | Banton et al. | 350/3.71 |
| 4,707,137 | 11/1987 | Lee | 356/359 |
| 4,733,253 | 3/1988 | Daniele | 372/29 |
| 4,737,798 | 4/1988 | Lonis et al. | 372/29 |

OTHER PUBLICATIONS

Fairchild Camera and Instrument Corporation "Model CCD1300 Line-Scan Camera Subsystem", Instruction Manual, 1977.
Thermoelectrics, Midland Ross Electronic Connector Division/Cambion, Hollingsworth, SAE, Midland-Ross Corporation, One Alewife Place, Cambridge, Mass., pp. 3-5.
Carter et al., "Hologram Laser-Beam Corrector and Combiner for a Satellite Data Link", printed in Applied Optics, vol. 24, No. 14, Jul. 14, 1985, pp. 2150-2155.
Gilbreath-Frandsen et al., "Some Research Toward the Development of a Hologram Laser Beam Corrector-Collimator for Use in a Satellite Data Link" reprinted from SPIE, vol. 600, Progress in Holographic Applications, 1985, pp. 81-88.
Gilbreath et al., "Holographic Optical Elements Which Diffract Efficiently in the Near-Infrared for Operation with Laser Diodes for Spacecraft Communication", reprinted in SPIE, vol. 747, Practical Holography II(1987) pp.43-50.
Gilbreath et al., "Absorption Holograms Made with Mode-Stabilized Laser Diodes for Use in a Satellite Communications Link", reprinted in Optics Letters, vol. 12, p. 648, Sep. 1987.

Primary Examiner—Bruce Y. Arnold
Assistant Examiner—R. D. Shafer
Attorney, Agent, or Firm—Thomas E. McDonnell; A. David Spevack

[57] ABSTRACT

A technique is presented involving a laser diode stabilized in a single mode employing active cooling at a specific current density to produce a preselected wavelength of coherent radiation. This output is used to expose for a very short time, a very sensitive holographic recording material before the diode can return to an unstable multi-mode, hence multi-wavelength radiation condition which would have adverse consequences to the hologram-making process.

12 Claims, 5 Drawing Sheets

METHOD FOR MAKING HOLOGRAMS WITH COHERENT RADIATION FROM A STABILIZED LASER DIODE THAT HAS BEEN ACTIVELY COOLED

This invention relates to a method for making holograms and relates in particular to a method for making holograms with coherent radiation from a stabilized laser diode that supplies a specific wavelength of radiation to record an interference pattern into a holographic recording medium (e.g. an infrared sensitive plate) very sensitive to that wavelength region.

BACKGROUND OF THE INVENTION

Holographic optical elements have direct applications for satellite laser communications if they can correct and direct a communication beam from a specific laser diode or diode array. If a diode and its companion holographic solution are to be used as part of the transmitter subsystem in communication links, two equally important criteria must be met during reconstruction. These are high diffraction efficiency into a single order and reliable wavefront reproduction. The first criteria is set by selecting a recording medium which has high diffraction efficiency.

The second criteria is met by recording a hologram with the actual beamfront of a laser source to be used in the system hence a medium sensitive at the wavelength of the laser is required if the diode's wavefront is to be directly recorded.

Laser diodes and diode arrays typically considered for use in communication links of interest radiate in the near-Infrared (750–900 nanometers). To date, there is no holographic recording material which is both sensitive at these wavelengths and diffracts with high efficiency. In order to exploit presently available materials for this application, a two-step construction, three-step reconstruction approach may be used. U.S. patent application Ser. No. 938,314, filed Dec. 5, 1986, by C. Gilbreath-Frandsen, now C. Gilbreath, and J. W. Wagner describes a method for holographic correction of beams of coherent radiation which employs such an approach. In this approach, an absorption hologram is constructed employing coherent radiation from a laser diode and an IR-sensitive emulsion as a holographic recording medium. An uncorrected output beam from the diode is combined with a corrected beamfront and the resulting interference pattern is recorded in the medium as the "master". A second hologram is then made in a second material which diffracts efficiently at the wavelength at which the medium is sensitive. The "master" is placed in one of two legs of an interferometer and the reconstructed initial hologram formed by the master serves as the new "object beam". The second hologram is an optically thick phase hologram. It is then developed, illuminated with the original aberrated diode output and the corrected "communications" beam is recovered at high diffraction efficiencies.

The procedure just outlined can yield diffraction efficiencies of greater than 94% when Dichromated Gelatin (DCG) is employed as the second medium.

As taught in U.S. patent application Ser. No. 938,314, a master hologram or master is used to make a working hologram This master hologram is an absorption hologram, and in the example, was an absorption transmission hologram because the recording medium absorbs radiation in proportion to the optical density of dark and light regions formed by the interference pattern.

A laser diode supplying coherent radiation used in making a master tends to become unstable for time intervals characteristic of standard holographic recording media and will go unstable, that is radiate at multiple wavelengths from time to time if not fixed at a specific operational condition. The present patent application presents a procedure to make holograms using diodes incorporating a method to stabilize the diode and monitor modal response in the process of making holograms. Without such a method, holograms can be made under laboratory conditions, but these holograms have poor holographic qualities if any. A specified procedure is needed to produce high quality holograms repeatably. A solution to the problem of stabilizing the diode and employing such a procedure is provided by the method of the invention.

A paper entitled "Holographic Optical Elements which Diffract Efficiently in the Near-Infrared for Operation with Laser Diodes for Spacecraft Communications", by C. Gilbreath and A. E. Clement, SPIE Vol. 747, Practical Holography II, May 1987, pp. 43–50 illustrate a technique for determining coherence length of a laser diode mode stabilized through active cooling and presents a procedure for making repeatably good holograms using laser diodes in a IR-sensitive medium. This paper is incorporated by reference into the instant patent application.

A paper entitled "Absorption holograms made with mode-stabilized laser diodes for use in a satellite communications link", by G. C. Gilbreath and A. E. Clement, published in Optics Letters, Vol. 12, pp. 648–650, September 1987, addresses both the problem and a solution to the problem via an experimental technique for constructing absorption holograms in a holographic medium, which is IR-sensitive, with a mode-stabilized laser diode.

These two papers provide a basis for the instant specification and accompanying claims drawn to an invention described and claimed in the instant patent application. These papers are incorporated by reference into the instant patent application.

The problem can be defined in these terms. Modal instability results from radiation from a diode that occurs at different frequencies (i.e. wavelengths) when radiation of only one frequency (i.e. wavelengths) is required. Modal stabilization is required to achieve radiation at a specific frequency. One way to do that is to control the temperature at which the diode operates for a specific current density. Laser diode coherence length must be known so that the interferometer used to make the hologram enables the formation of interference fringes.

A paper entitled "Some Research Toward the Development of a Hologram Laser Beam Corrector-Collimator For Use In a Satellite Data Link", by C. Gilbreath-Frandsen, William H. Carter and J. W. Wagner, SPIE Vol. 600 Progress in Holographic Applications 1985, pp. 81–88, illustrates a technique for measuring the coherence length of a laser beam diode that has been examined for modal stability.

SUMMARY OF THE INVENTION

This invention provides a method for constructing a hologram using a mode-stabilized laser diode and a holographic recording medium (e.g. an IR-sensitive emulsion) very sensitive to coherent radiation of a specific wavelength which is supplied by the stabilized laser diode. Diode modal instability resulting from radiation at different frequencies (i.e. wavelengths) characteristic of laser diode behavior is eliminated through preventative measures. Diode temperature stabilization required for a given current density to achieve radiation at a specific frequency (i.e. wavelength) is accomplished. Before a hologram is recorded in the holographic recording material, a diode candidate is, and must be, characterized for modal stability and coherence length.

The invention provides a method for exposing a recording medium very sensitive to radiation at a specific wavelength region in which the specific wavelength of radiation of the diode falls. A hologram is successfully recorded in the medium within a short time interval (typically milliseconds). The method is successful because the medium is extremely sensitive to the diode's specific wavelength region of radiation, the diode is stabilized and so radiates coherently during the exposure period, and the high optical output which characterize laser diodes can be exploited in combination with the highly sensitive film to enable extremely short exposure periods.

The method of the invention involves certain steps such as running an "actively cooled" laser diode at a specific current density before exposing a recording medium to coherent radiation of a specified wavelength and simultaneously monitoring the diode's modal response to verify that the diode is producing coherent radiation of the specific wavelength as a result of operating the diode at a specific temperature and current density. The method involves a step of exposing the recording medium to the incident radiation for a short interval of sufficient duration to result in a hologram being formed in the medium but short enough such that the diode remains stable without cooling during exposure The method outlined above is followed by a step that involves developing with handling methods specified by the plate manufacturer the already exposed recording medium to form a (master) hologram.

This invention provides, as will be explained, a technique for constructing absorption holograms in IR-sensitive material with mode-stabilized laser diodes. Infrared spectrographic emulsion is found to be very sensitive compared to other holographic record media. Typical "good" energy densities are on the order of millijoules ($10^{-3}$) per square centimeter. For Applicants' type of emulsion, energy densities on the order of nanojoules ($10^{-9}$) per square centimeters are employed. The combination of an extremely sensitive recording medium and a high power laser diode is exploited to enable one to employ minimum exposure times well within the limits in which the laser diode remains stable at a specific wavelength when properly stabilized though active cooling at a specific current density. The medium and stabilized diode together with the high power available from the laser circumvent inherent modal instability of the laser diode. Recording the interference pattern in the medium can consequently be achieved before the laser diode can return to an unstable mode of operation. These absorption holograms are used, for example, as the first step in a two-step process to produce holographic optical elements for use with laser diodes in a satellite communication links. Other applications unrelated to such application are clearly possible.

This invention provides, as will be explained, a method for successfully exposing a holographic recording medium for only a short interval when constructing a hologram in the medium. The method performed involves a sequence of steps followed by a last step of developing the exposed medium to form a finished (e.g. master) hologram. The sequence steps involve (1) continuously running a laser diode at a specific current density to cause the laser diode to produce a specific wavelength of coherent radiation that radiates from the diode; (2) using a variable "active cooler" with the laser diode to cool the diode to a specific temperature, bringing the diode into a state whereby for a specific combination of current density and temperature, the diode radiates at a single frequency as evidenced by radiation into a single mode; (3) monitoring the laser diode-generated coherent radiation to quantify the specific wavelength at which the conditions cause the diode to radiate with stability in a single-mode; (4) adjusting the level of cooling of the diode by adjusting the cooler iteratively by observing the output from the spectrometer and/or the variable current source to eventually fix the operating diode into a condition in which the wavelength of coherent radiation produced by the diode stays constant; (5) once the diode is stabilized, turning off the TEC and other sources of environmental instability and quantifying the time at which the mode begins to lose amplitude and when the diode "mode hops"; (6) constructing an interferometer and quantifying the coherence length of the diode for the temperature/current density "window" required for modal stability; (7) constructing an interferometer to make the hologram incorporating a spectrometer in the configuration to enable monitoring of the diode's modal behavior; (8) computing the exposure time exploiting the high power available from the diode and the energy density of the IR-sensitive material to enable exposure periods quite short with respect to the period in which the diode goes unstable without cooling; and (9) turning off the cooler and other sources of environmental noise then immediately exposing the record medium to the coherent radiation while the diode is stable, i.e. still produces only the preselected wavelength of coherent radiation, then immediately turning the cooler and other sources on and verifying modal stability. This step occurs timewise after "active cooling" has brought about stable radiation conditions from the diode.

Diode modal stability is achieved through temperature and current density control. The stability is then retained over the entire exposure interval, however short, when the laser diode is used to expose a recording medium.

The novel technique employs a thermolelectric cooler and variable current supply to stabilize a laser diode by finding the temperature-current "window" for single-mode operation, and the incorporation of a spectrometer to monitor and quantify modal stability before and after exposure.

OBJECTS OF THE INVENTION

An object of the invention is to provide a method for producing a hologram using coherent radiation from a mode-stabilized laser diode to expose holographic recording material very sensitive to the wavelength region in which the diode radiates.

Another object of the invention is to provide a method for producing a hologram with coherent radiation from an actively cooled laser diode, driven at a specific current density.

Another object of the invention is to provide a method for reliably producing a viable hologram repeatably which exhibits high diffraction efficiency as limited by the type of hologram and medium selected, and exhibits wavefront fidelity.

Yet another object of the invention is to provide a procedure to construct a hologram using a laser diode and an IR-sensitive emulsion whereby the high power from the diode and extreme sensitivity to Infrared radiation of the emulsion is exploited to enable extremely short exposure times. Short exposure times mean that repeatable holograms of quality can be provided since the cooler and other sources of environmental noise can be turned off during exposure without risking "fringe washout" which happens when the diode changes modes.

Another object of the invention is to provide a method for constructing the hologram such that a means to monitor modal stability throughout the process is enabled.

BRIEF DESCRIPTION OF THE DRAWINGS

FIG. 1 is a flow chart summerizing in brief the steps utilized in practicing the method of the invention.

FIG. 2 is a detailed flow chart of a method provided by the invention.

FIG. 3 is a schematic diagram of system components used to characterize a candidate laser diode in terms of diode coherence length and modal stability.

FIG. 4 is a schematic diagram of the optical configuration used to expose a holographic record medium to an interference fringe pattern forming a hologram in the medium after development.

BRIEF DESCRIPTION OF THE PREFERRED EMBODIMENT

Figure 1:
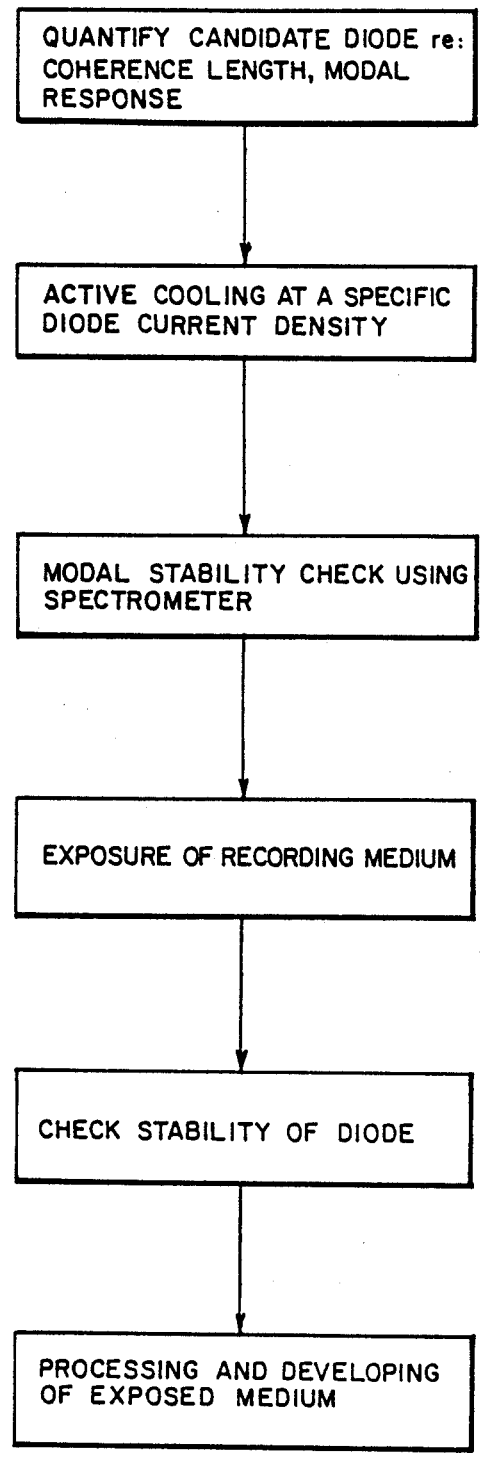
FIGS. 1-4 taken together illustrate a method provided by the invention and system that can be used to practice the method of the invention.

Referring now to the drawings, a system for producing repeatably viable holograms with a stabilized laser diode is illustrated in the context of a particular exemplary system, labeled 10, found satisfactory for carrying out the method of the invention.

Referring now to FIG. 1 of the Drawings, the method of the invention is illustrated by a flow chart showing a sequence of steps involving quantifying a candidate laser diode in terms of coherence length and modal response; active cooling of a laser diode at a specific current density, laser diode modal stability verification prior to exposure using a spectrometer, exposure of a holographic recording medium, checking the diode stability after the exposure of the medium, and standard processing and development. The active cooling of the laser diode operated at a specific current density brings about modal stability of the laser diode, which is monitored with a spectrometer, and conditions the laser diode such that is radiates continuously in a single mode.

Figure 2:
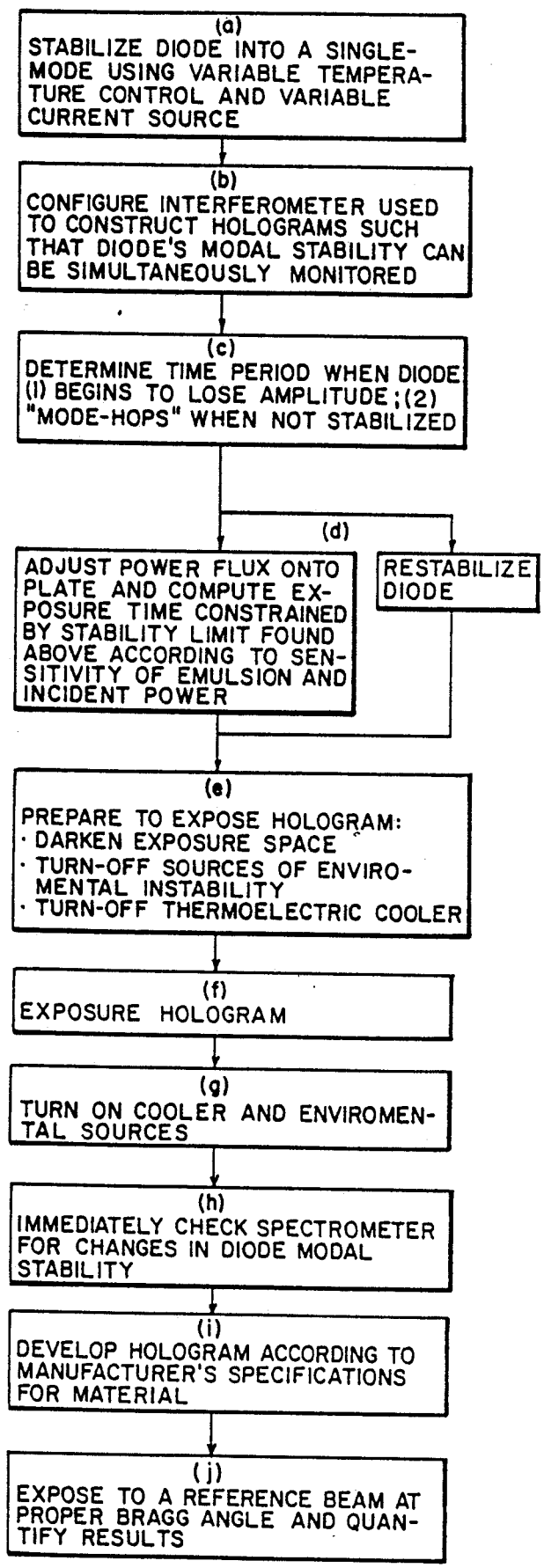

Referring now to FIG. 2, the method of the invention is illustrated therein by a second flow chart depicting a complete sequence of steps. As illustrated, the method involves a first step, to wit, stabilize a selected laser diode into a single-mode using variable temperature control and a variable current source. This step is labelled step (a) in the flow chart. Next, configure interferometer used to construct holograms such that the diode's modal stability can be simultaneously monitored. The interferometer must be constructed such that the path length difference between the two "legs" do not exceed the coherence length of the stabilized diode. This is step (b) in the flow chart. Next, determine a time period when the diode begins to lose amplitude and mode-hops when not stabilized (Step (c) in the flow chart). Having determined the time period that the laser diode will operate stably without temperature control, use the interferometer and temperature controller to restabilize the laser diode (step (d)). Next, adjust power flux onto plate and compute the exposure time constrained by the stability limit found above, according to the sensitivity of emulsion and incident power. (Step (d) in the flow chart). Next, prepare to expose hologram: darken exposure space, turn-off sources of environmental instability, turn off thermoelectric cooler (TEC) (Step (e) in the flow chart). Next, expose hologram (Step (f) in the flow chart). Next, turn on the thermoelectric cooler (TEC) and environmental sources (step (g) of the flow chart). Next, immediately check spectrometer for changes in modal stability (Step (h) of the flow chart). Next, develop hologram according to manufacturers's specification for holographic material (Step (i) of the flow chart). Lastly, expose hologram to a reference beam at the proper Bragg angle and quantify characteristics of the reconstructed beam. The exposure interval is short so that the intensity of the radiation incident on the medium does not suffer attenuation. (Step (j) of the flow chart).

The exposure time, when the medium is exposed to radiation, is proportionate to the energy density and inversely proportionate to the level of radiation power incident on the medium. Exposure time, $t_e$, is equal to the energy density, e.d., expressed in joules per square centimeter, divided by the incident power, p, expressed in watts per square centimeter, then multiplied by a unit conversion factor, k, expressed in watt-seconds per joules, per the formula $t_3 = (e.d. \div p)k$. The exposure time is short, with the result that the intensity of the radiation incident on the medium does not suffer attenuation. Exposure time, $t_e$, takes into account the circumstance that the laser diode power output and the medium sensitivity are inversely related, so that high diode power permits use of a less sensitive medium and, conversely, a highly sensitive medium permits use of a diode of less power.

Figure 3:
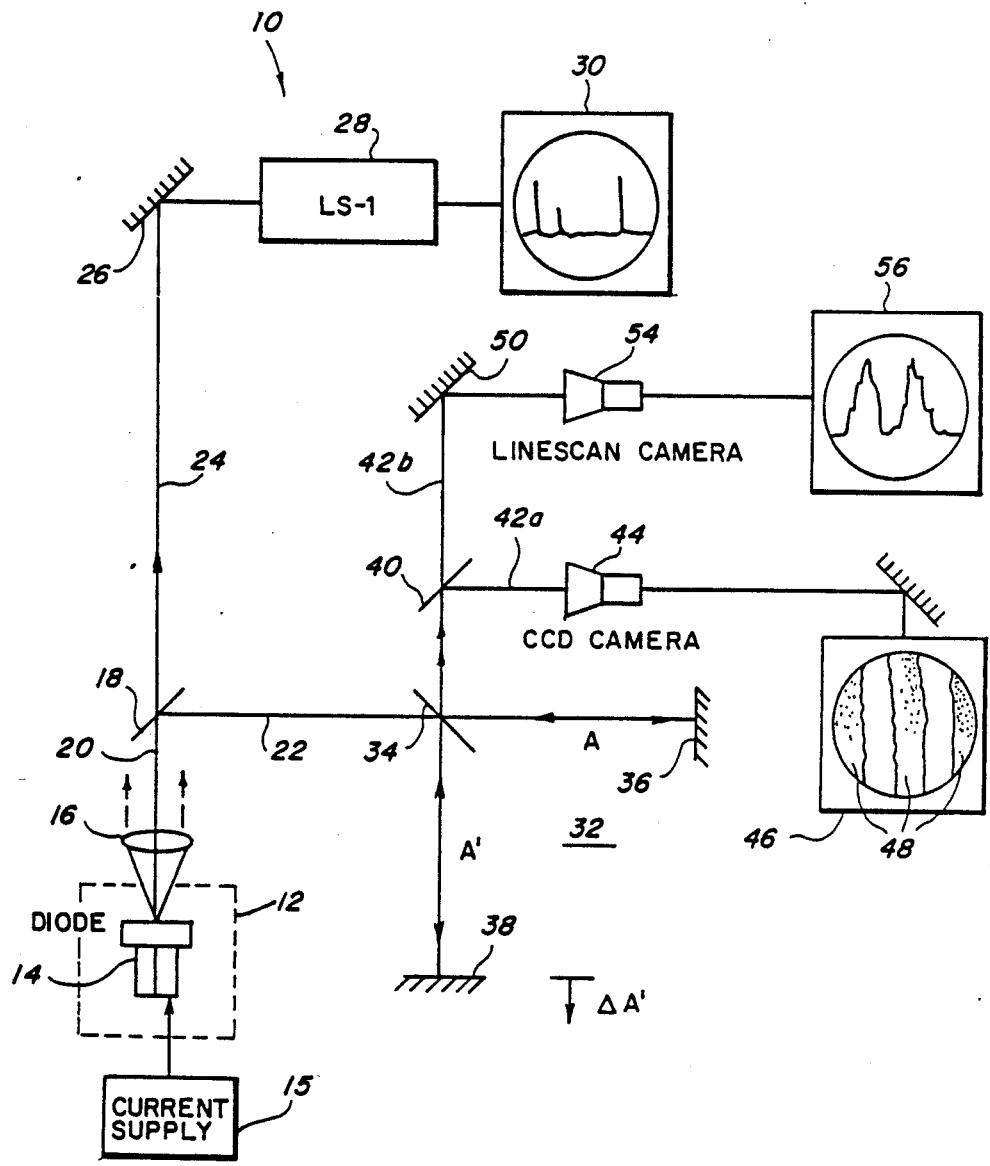

Referring now to FIG. 3, the system 10 includes a variable thermoelectric cooler (TEC) 12, a laser diode 14 coolable by the TEC 12, a variable current supply, 15, which drives the diode 14, a lens 16 with a short focal length for collecting the widely diverging coherent radiation produced by laser diode 14, a beam-splitter 18 for splitting a semi-collimated beam 20 of coherent radiation into two beams 22 and 24, a fixed mirror 26 for reflecting beam 24, a laser spectrometer 28 (Candela LS-1 used in the experiment) for monitoring the modal response from the diode, 14, and an oscilloscope 30 for displaying signals indicating both the intensity and frequency of coherent radiation generated by laser diode 14.

Still referring to FIG. 3, system 10 further includes a Michelson interferometer 32, coupled to the laser diode, 14, by a beam splitter 18. The purpose of the interferometer is to form an interference pattern from the coherent radiation by interaction of beam 22 with a beam splitter 34, a fixed mirror 36, and a movable mirror 38. A beam-splitter 40 directs a portion of the recombined beam 42a to a CCD camera 44. A video monitor 46 displays a pattern 48 of alternating light and dark fringes. A fixed mirror 50 directs a portion of the recombined beam 42b to a linescan camera 54. An oscilloscope 56 displays a one-dimensional profile of the interference pattern, enabling characterization of fringe visibility for a given path length difference.

FIG. 3 presents a bench configuration used to determine the coherence length of a selected laser diode. The configuration employs a standard Michelson interferometer 32, modified with a spectrometer 28, a CCD field camera 44, and a linescan camera 54.

A standard thermoelectric cooler 12 and a commercially available laser diode 14 were used. The cooler 12 that was used was a cambion P/N 3458-01 which was voltage driven to achieve a specific temperature. The cooler was clamped to a metal heat sink to dissipate heat generated by the cooling process.

A commercially available Sharp 30mW single-mode diode 14 was used in which the glass window in the can housing of the diode was removed to reduce self-interference fringes. A standard Michelson interferometer 32 was also employed.

A Candela LS-1 spectrometer 28 was used to monitor diode response to determine the proper diode current and diode temperature parameters for stable operation. As previously stated, the diode 14 was actively cooled using a Cambion thermoelectric cooler (TEC) 12 and driven by a M/ACOM variable current supply, 15. A current-temperature "window" was found which tolerated slight current drift without causing fluctuation in the diode output radiation. Diode 14 was driven at I=90 ma to produce a wavelength of 842.4 nanometers (nm).

The line-scan camera 54 was employed in the characterization of fringe visibility for a given path displacement. Visibility, V(r), is defined by Michelson as:

$$V(r) = (I_{max} - I_{min})/(I_{max} + I_{min})$$

where $I_{max}$ and $I_{min}$ are the irradiances corresponding to the maximum and the adjacent minimum levels in the fringe system.

The thermoelectric cooler (TEC) 12 used to cool diode 14 was then turned off as were other sources of environmental noise and the behavior of diode 14 was monitored as it warmed. In the experiment, the mode at which diode 14 had stabilized during active cooling began to lose amplitude in about 20 seconds and diode 14 suffered a "mode hop" in a little more than a minute. A mode hop causes a fringe "wash-out", thereby preventing holographic construction.

FIG. 3 described above shows the bench configuration actually used in practicing certain steps that are part of the method of the invention. This configuration enables concurrent characterization of modal stability, fringe contrast, and wavefront quality, while determining coherence length.

Figure 4:
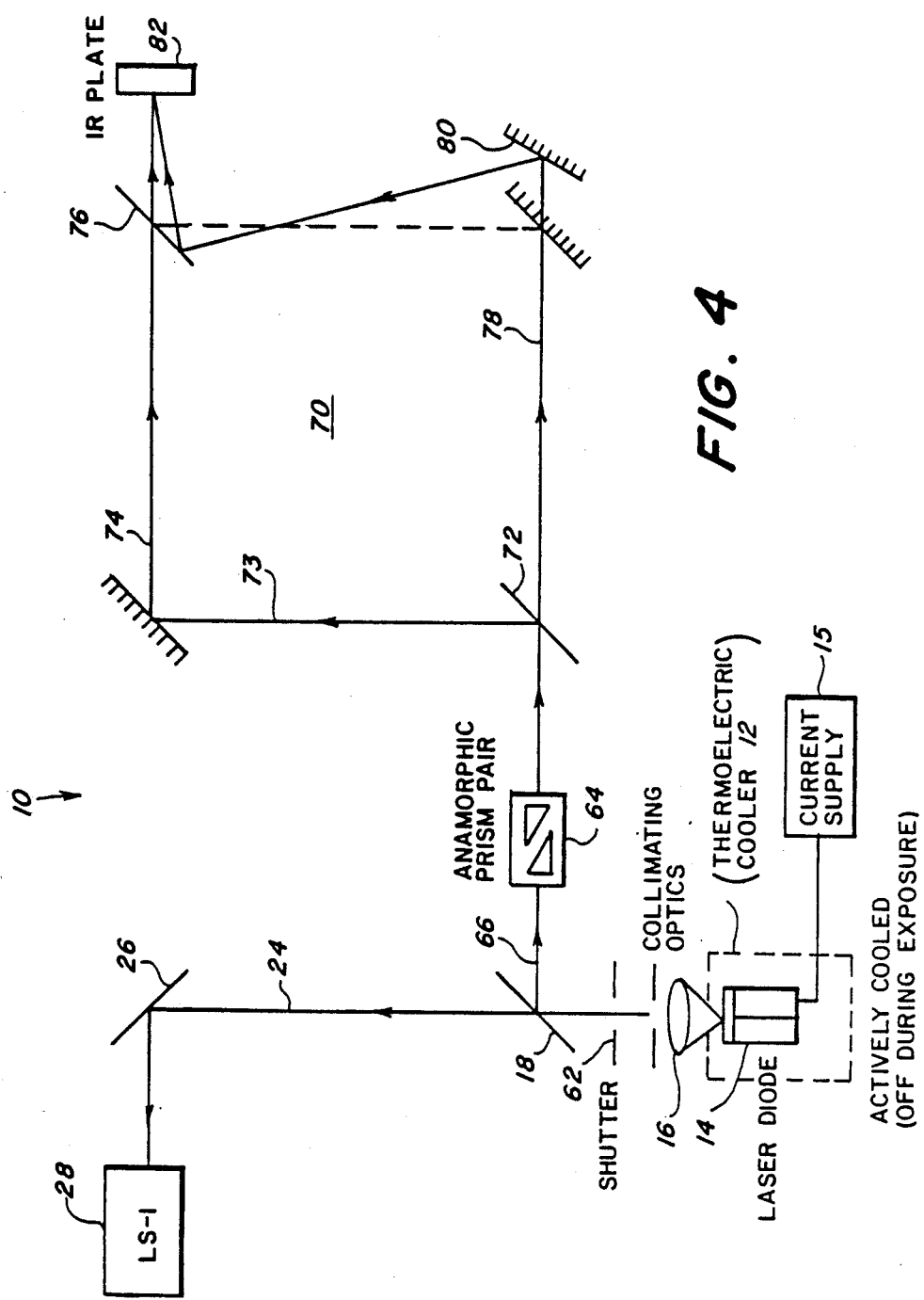

Referring now to FIG. 4, system 10 laser diode, 14, is shown cooled by a variable thermoelectric cooler (TEC), 12, and driven by a variable current supply 15. It further includes a collimating lens with a very short focal length, 16, needed to capture the light from the widely diverging laser diode. A shutter 62, is included and is a normally closed, electronically controlled, timed shutter that blocks coherent radiation from reaching other system components as shown in FIG. 4. An LS-1 spectrometer 28 is coupled by mirror 26 and beam splitter 18 to the laser diode 14 and monitors coherent radiation from laser diode 14 only when shutter 62 is opened The oscilloscope 30 (shown only in FIG. 3) is covered so that the luminescence of this monitor does not escape into a fully dark room and fog the holographic medium prior to and after exposure. An anamorphic prism pair 64 near beam splitter 18 corrects to some degree the asymmetry of beam 66 which is directed to a Mach-Zehnder interferometer 70. A beam splitter 72 of interferometer 70 splits incoming coherent radiation into two beams to send a beam 73 toward a fixed mirror 74 and from there to a beam-splitter 76 where 72 is recombined with beam 78. Beam 78 is directed to a movable, tiltable mirror 80 and from there to the beam-splitter 76. An infrared sensitive plate, or IR-plate, 82 is located with respect to the recombined beam as shown, to record the hologram when shutter 62 is opened for a short interval.

Plane wave absorption gratings (i.e. absorption holograms formed in plate 82) were made using the Mach-Zehnder interferometer 70, the Sharp diode 14, and Kodak Spectroscopic IV-N plates 82. Spectroscopic film is highly sensitive in the wavelengths of interest. A number of emulsions are currently available. Kodak IV-N provides the greatest resolution in commercially available IR-sensitive emulsions (100–200 lines pairs per millimeter). The low resolution of the emulsion requires small angles of construction. This type of interferometer employed, namely the Mach-Zehnder interferometer 82, enables good control of small angle displacements. The diode's output radiation was partially collimated using a 8 mm focal length lens 16 and the asymmetry of the beamfront was somewhat corrected using an anamorphic prism pair 64. Part of the radiation beam was directed to the Candela LS-1 spectrometer 28 enabling human operators to monitor diode's modal stability throughout the procedure.

FIG. 4 illustrates a bench configuration actually employed in practicing certain steps that are part of the method of the invention. Holographic plate 82 was tilted with respect to the incident beams to achieve Bragg angle recording symmetry. The angle of incidence of the beams was computed using Bragg's Law constrained by the resolution of the material. A beam ratio of 2:1 was used, the intensity of one beam being, in this instance, twice that of another beam.

As previously noted, in order to retain fringe stability, diode 14 has to be constantly cooled at a specific current density lest mode-hopping prevent holographic recording. By exploiting the extreme sensitivity of the material of plate 82 and the high power available with diode 14, very short exposure times were possible. As a consequence, the TEC, or cooler, 12 could be, and was, turned off during exposure. This procedure of turning off cooler 12 immediately before exposing plate 82, enhanced environmental stability during recording and ensured modal stability. Stability was monitored by checking the output of the LS-1 monitor 28 immediately prior to and just after exposure. Energy densities of the plates were experimentally found to be 56 nJ/cm$^2$ (nanoJoules per square centimeter) at a wavelength of 842.4 nanometers. The exposed plates 82 were developed using standard D-19 chemistry techniques employing rapid fixer with hardener. Exposure and handling procedures which yield consistently repeatable results are summarized in TABLE 1.

TABLE 1
IR EXPERIMENTAL TECHNIQUE

ACTIVE COOLING
MODAL STABILITY CHECK:
LS-1
EXPOSURE: 56 nJ/cm$^2$
PROCESSING: 20° C.

| CHEMICAL | TIME | CONDITION |
| --- | --- | --- |
| D-19 | 5 MIN | DARK |
| RAPID FIXER W/HARDENER | 4 MIN | DARK |
| DISTILLED WATER | 20 MIN | LIGHT |

DRYING: COOL AIR

TABLE 1 specifies active cooling of diode 14 by cooler 12, a modal stability check of diode 14 by LS-1 28, and exposure of plate 82 to a radiation level of 56 nJ/cm$^2$. TABLE 1 further lists processing of plate 82 at 20° Centigrade, using chemicals, namely D-19, for 5 minutes in a dark room; rapid fixer with hardener for 4 minutes in a dark room, and distilled water for 20 minutes in a normally lit room. TABLE 1 also indicates drying of processed plates 82 in cool air.

After processing the plates, diffraction efficiencies out of the zero order and into the first order were measured using a 632.8 nm Helium Neon source and a United Detector Technology detector. Diffraction efficiency was computed as the ratio of power in a specific order to total power after it transmitted through the plate. Absolute efficiencies were also measured. Recorded fringe quality and visibility were examined and measured.

Figure 5:
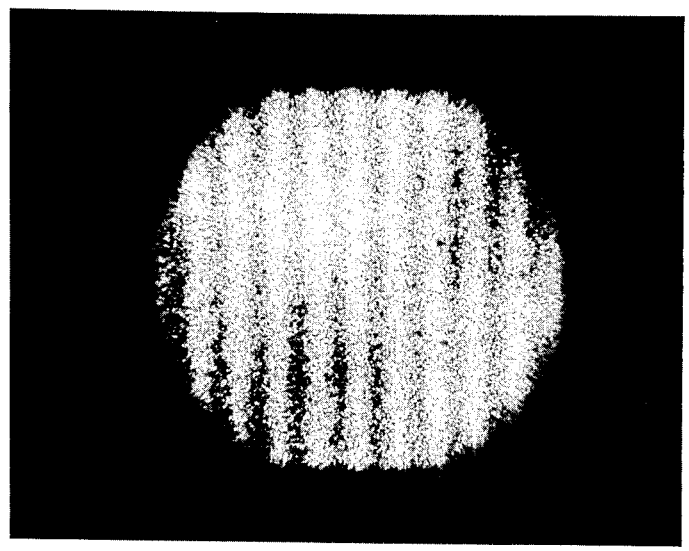
FIG. 5 shows fringe recording quality and contrast for a two sample holograms made by a procedure described herein.
Figure 5:
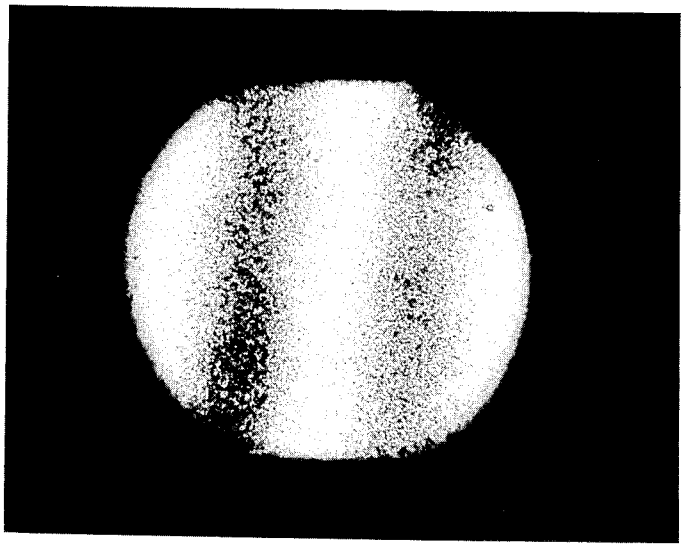

Table 2 lists recorded grating spacing, $d_u$, diffraction efficiencies $n_o(\%)$, $n_1(\%)$; optical densities O.D., and visibility V(r) for selected samples. Gratings made using smaller values for $d_u$ yielded significantly lower diffraction efficiencies $n_o(\%)$, $n_1(\%)$ indicating that the resolution of the material may be less than reported by the manufacturer. The material seems to provide a resolution on the order of 125 line pairs per millimeter instead of the specified 200. Gratings made with smaller angles of construction, and therefore larger values of d, yielded good efficiencies. Recorded fringes for two samples yielding over 3% and 14% diffraction efficiencies into the first order respectively are shown in FIG. 5.

TABLE 2
IR MASTER VISIBILITY AND DIFFRACTION EFFICIENCY* MEASURED WITH 632.8 nm

| SAMPLE | d($\mu$) | V(r) | $\eta_0(\%)$ | $\eta_1(\%)$ | O.D. |
| --- | --- | --- | --- | --- | --- |
| 3 | 8.0 | 0.296 | 66.0 | 0.81 | 0.324 |
| 5 | 16.2 | 0.673 | 70.1 | 3.36 | 0.398 |
| 8 | 71.6 | 0.930 | 69.7 | 14.60 | 0.194 |
| 10 | 11.4 | 0.549 | 82.1 | 1.90 | 0.287 |
| 15 | 7.2 | 0.097 | 68.8 | 0.54 | 0.375 |

*$\eta_0$ IS DIFFRACTION EFFICIENCY OUT OF ZERO ORDER
*$\eta_1$ IS DIFFRACTION EFFICIENCY INTO FIRST ORDER The term "active cooling" refers in this case to a "cooling" that is performed and causes a response in the diode's radiation as indicated by the mode profile read from the oscilloscope. Variable active cooling is necessary to adjust the operating temperature of the diode so that the diode radiates with stability in a single mode for a specific current density. Without such control, a "mode hop" can occur. The cooler is adjusted to bring the source which is driven at a specific current density to a condition in which the cooling rate exactly balances the offsetting influence of source-generated and/or environmentally caused heat in an otherwise uncontrolled environment. In the cited example, the TEC and current source were adjusted normally to achieve stable single-mode operation.

Mode stabilization through adjusting temperature and current parameters need not be performed by a human operator, as described, but can be performed by a feedback loop delivering negative or positive feedback to the cooler and/or current supply, as circumstances dictate. In the case of closed loop TEC adjustment a possible form of feedback would involve the use of a thermistor coupled to a heat sink clamped to the laser diode source and to the cooler so that heat sink, hence, diode temperature changes sensed by the thermistor are translated into appropriate changes in current flowing in the thermoelectric cooler (TEC), thereby reducing the desired change in temperature.

Obviously, many modifications of the invention and variations of the invention are possible in light of the above teachings. It is, therefore, to be understood that within the scope of the appended claims the invention may be practiced otherwise than as specifically described.

What is claimed and desired to be secured by letters patent of the United States is:

1. A method for repeatably constructing a viable hologram with good wavefront fidelity and high diffraction efficiency made with a mode stabilized laser diode by exposing a recording medium sensitive to infrared coherent radiation which is characteristic of laser diode emission, comprising the steps of:

running an actively cooled laser diode at a specific current density for an interval prior to exposing a recording medium to stabilize single-mode radiation from the diode and monitoring the diode's modal response indicating that the diode is producing a specific wavelength of coherent radiation as a result of being actively cooled immediately prior to exposure, and turning off said active cooling means and other sources of environmental instability;

constructing an interference pattern from the coherent radiation via an interferometer, and exposing a recording medium to the formed interference pattern for an interval of sufficient duration to form a hologram in the medium once the medium is developed, the interval being short enough that the intensity of the radiation incident on the medium does not suffer attenuation; and developing the exposed recording medium to form said hologram.

2. The method of claim 1 further comprising the steps of determining the coherence length of the laser diode while actively cooled at a specific current density so that the interferometer is constructed such that the interferometer path length difference does not exceed the coherence length; consequently, an interference pattern can be formed from the stabilized coherent source 3. The method of claim 1 wherein the interferometer used to construct the hologram incorporates a means to monitor the diode's frequency stability prior to and immediately after exposure to the recording medium.

4. The method of claim 1 wherein an operator uses a thermolectric cooler coupled to the laser diode driven at a specific current density to achieve active cooling of the diode while using information displayed on a monitor to guide the operator in achieving modal stabilization.

5. The method of claim 1 wherein an operator uses a variable current power supply to drive the laser diode above the lasing threshold at such a density in combination with cooling to cause radiation in single mode.

6. The method of claim 1 wherein a feedback means is used to accomplish active cooling at a specific current density in response to information displayed on a monitor indicating whether or not the laser diode is, at any time, producing radiation at the particular wavelength, or is, instead producing radiation of other wavelengths demonstrating a need to adjust active cooling or current density to achieve stable single-mode radiation.

7. The method of claim 1 wherein an interferometer is used to construct a holographic interferometric pattern from the coherent radiation.

8. A method for exposing a recording medium to an interference pattern formed by coherent radiation, to form a viable hologram with good wavefront fidelity repeatably, comprising the steps of:
 providing a recording medium sensitive to coherent radiation of a specific wavelength;
 providing a candidate diode characterized in terms of coherence length and period of modal stabilization;
 actively cooling said candidate diode, driving the diode at a specific current density, and monitoring the diode to determine whether or not the diode is producing radiation of a specific wavelength as a result of modal stabilization;
 immediately prior to exposure, turning off a thermoelectric cooler used to actively cool the diode and turning off other sources of environmental instability;
 exposing the medium to an interference pattern derived from radiation of the specific wavelength via an interferometer for an interval less than said period of modal stabilization quantified in the characterization of the candidate diode, the interval being of adequate duration to record the pattern in the medium so that a hologram can be developed;
 immediately after exposure, turning the thermoelectric cooler back on as well as other sources of environmental instability and then observing the changes, if any, in the modal response to terms of amplitude and/or multi-mode generation; and
 developing the exposed recording medium, to form a hologram using standard techniques provided by the plate manufacturer.

9. A technique for ensuring mode stability of a single mode laser diode during exposure of a holographic recording medium to an interference pattern formed by interfering infrared coherent radiation from the laser diode with another source of infrared radiation, the laser diode having a period in which the diode remains stable without active cooling comprising the steps of:
 using a thermoelectric cooler and variable current supply to maintain the laser diode at a constant temperature and current condition during a pre-exposure interval in which the laser diode operates in a single mode;
 configuring a spectrometer in an interferometer used to construct the hologram, to monitor the laser diode output during the exposure of the holographic recording medium to the interference pattern;
 exploiting the high power available from the laser diode in combination with extreme sensitivity of the recording medium to the diode's wavelength, to compute a very short exposure time for the recording medium; this exposure time is to be well within the period in which the diode remains stable without active cooling, the exposure time being proportional to energy density and inversely proportional to radiation power incident on the medium; and
 quantifying modal response employing the spectrometer immediately prior to exposure, turning off the cooler and other sources of environmental noise, exposing the medium, turning back on the cooler and other sources, and quantifying modal response immediately after exposure.

10. A method of forming a hologram comprising steps for:
 selecting a laser diode means for generating coherent light;
 operating said laser diode at a constant preselected temperature and current to generate a first beam of coherent light;
 determining the length of time said laser diode means operates at a single mode and at said preselected current and temperature before commencement of mode-hopping;
 generating a second beam of light, said second beam being spatially and temporally coherent with said first beam;
 selecting a holographic emulsion having an optical sensitivity to said first and said second beam of coherent light, said sensitivity being sufficiently large to permit the recording of an interference pattern in said emulsion in said time period; and
 recording said interference pattern in said emulsion during said time period, comprising, in sequence, the substeps of:
 monitoring said laser diode to determine whether said laser diode is operating at said single mode and at said constant preselected temperature and current;
 responsive to said sub-step for monitoring, using a means for mode stabilizing said laser diode to prevent said laser diode from commencing to mode hop;
 interfering said first and said second beams of coherent light effective to form an interference pattern;
 turning off said means for mode stabilizing, thereby removing noise that could interfere with said forming of said hologram;
 exposing said emulsion to said interference pattern for said time period; and
 developing said emulsion into an effective hologram.

11. The method of claim 10, wherein both said first and said second beams of coherent light are between about 750 to 900 nanometers wavelength.

12. The method of claim 10, further comprising, in sequence between said step for exposing and said step for developing, steps for:
 turning said means for mode stabilizing back on effective to prevent mode hopping of said laser diode means; and
 again monitoring said laser diode to determine whether said laser diode is operating at said single mode and at said constant preselected temperature and current effective to confirm that said laser diode did not mode hop during said step for exposing.

* * * * *